(12) United States Patent
Fischer et al.

(10) Patent No.: US 6,771,527 B2
(45) Date of Patent: Aug. 3, 2004

(54) INTEGRATED DRAM MEMORY COMPONENT

(75) Inventors: Helmut Fischer, Oberhaching (DE); Athanasia Chrysostomides, München (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/650,818

(22) Filed: Aug. 28, 2003

(65) Prior Publication Data

US 2004/0076058 A1 Apr. 22, 2004

Related U.S. Application Data

(63) Continuation of application No. PCT/EP02/01593, filed on Feb. 14, 2002.

(30) Foreign Application Priority Data

Feb. 28, 2001 (DE) .......................................... 101 09 486

(51) Int. Cl.$^7$ ................................................ G11C 5/06
(52) U.S. Cl. ........................ 365/63; 365/205; 365/149
(58) Field of Search ......................... 365/63, 205, 210, 365/149

(56) References Cited

U.S. PATENT DOCUMENTS

| 4,045,783 A | 8/1977 | Harland |
| 4,402,063 A | 8/1983 | Wittwer |
| 4,634,901 A | 1/1987 | McElroy |
| 4,747,078 A | 5/1988 | Miyamoto |
| 4,800,525 A | 1/1989 | Shah et al. |
| 4,984,197 A * | 1/1991 | Sakagami ..................... 365/63 |
| 5,495,440 A * | 2/1996 | Asakura ..................... 365/149 |
| 5,610,868 A | 3/1997 | Inaba et al. |
| 6,147,918 A | 11/2000 | Takashima et al. |
| 6,392,942 B2 * | 5/2002 | Noda et al. ................. 365/205 |

FOREIGN PATENT DOCUMENTS

JP 58012195 A 1/1983

* cited by examiner

Primary Examiner—Huan Hoang
(74) Attorney, Agent, or Firm—Laurence A. Greenberg; Werner H. Stemer; Ralph E. Locher

(57) ABSTRACT

An integrated DRAM memory component has sense amplifiers which, respectively within the framework of the integrated component, are formed from a multiplicity of transistor structures, arranged regularly in cell arrays, and signal interconnect structures with amplification transistors for bit line signal amplification. The amplification transistors are of identical design and they lie opposite one another in pairs in adjacent transistor rows. Signal interconnects, which are associated with the transistor rows and run parallel thereto, supply actuation signals. The signal interconnects for the actuation signals have the same arrangement symmetry as the amplification transistors, which means that the amplification transistors in adjacent transistor rows are in the same signal interconnect proximity.

1 Claim, 2 Drawing Sheets

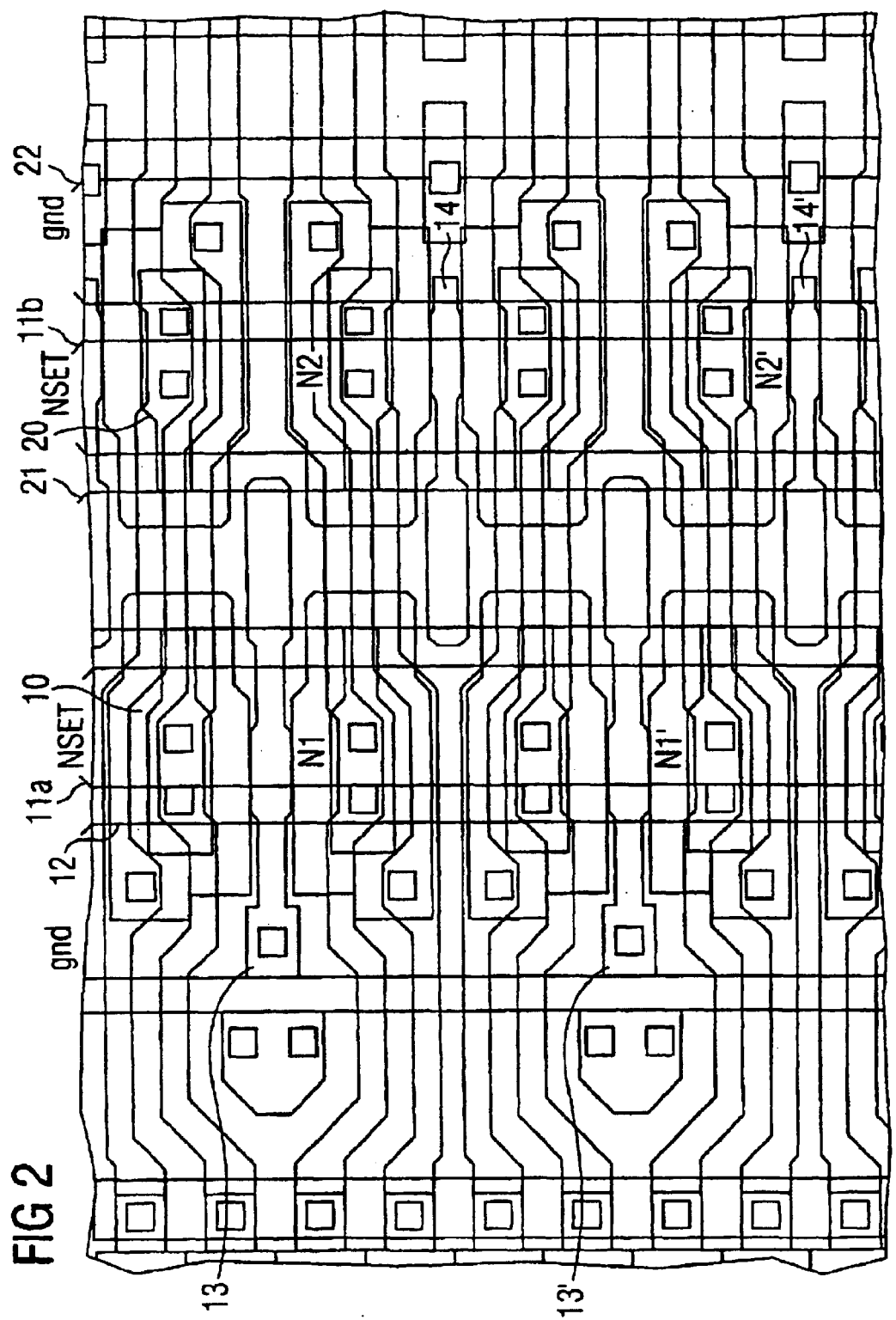

INTEGRATED DRAM MEMORY COMPONENT

CROSS-REFERENCE TO RELATED APPLICATION

This application is a continuation of copending International Application No. PCT/EP02/01593, filed Feb. 14, 2002, which designated the United States and which was not published in English.

BACKGROUND OF THE INVENTION

FIELD OF THE INVENTION

The invention relates to an integrated DRAM memory component having sense amplifiers which, respectively within the framework of the integrated component, are formed from a multiplicity of transistor structures, arranged regularly in cell arrays, and signal interconnect structures which comprise amplification transistors for bit line signal amplification, which are of identical design and are opposite one another in pairs in adjacent transistor rows, and signal interconnects, which are associated with the transistor rows and run parallel thereto, for supplying actuation signals.

In such an integrated memory component, the bit line signal is typically amplified by four amplification transistors. The sense amplifiers respectively adjacent to four amplifier transistors are arranged next to one another in the layout in a row or in the form of a strip and thus form a regular structure. In particular these transistors are respectively arranged in pairs opposite one another in the rows, are of identical design and are arranged at an equal distance from one another in the row or in the strip. On account of the very small dimensions of the respective sense amplifier, this regular structure is a necessary prerequisite for the exact mapping of a predetermined geometry on a wafer.

A problem with the current integrated DRAM memory component of the above-mentioned type is that the asymmetrical arrangement of the signal interconnects for supplying actuation signals to the transistor structures means that different capacitive coupling of these signals into the amplification transistors can result in the response of the memory component's sense amplifier becoming asymmetrical, particularly in the case of small bit line signals. A consequence of this is that weak memory cells are not read correctly, which ultimately affects the yield, because signal reserve is lost on account of the asymmetrical response of the sense amplifiers, which also manifests itself in a correspondingly impaired signal-to-noise ratio.

U.S. Pat. No. 4,402,063 discloses an integrated memory component of the generic type. Similar memory component layouts are described in U.S. Pat. No. 4,634,901 and U.S. Pat. No. 4,747,078.

Summary of the Invention

It is accordingly an object of the invention to provide an integrated DRAM memory component, which overcomes the above-mentioned disadvantages of the heretofore-known devices and methods of this general type and which ensures that the response of the sense amplifiers is symmetrical even in the case of small bit line signals.

With the foregoing and other objects in view there is provided, in accordance with the invention, an integrated DRAM memory component, comprising:

sense amplifiers each formed from mutually adjacent transistor rows and having amplification transistors for bit line signal amplification and signal interconnects for supplying actuation signals to said amplification transistors;

said amplification transistors being structurally identical and being disposed opposite one another in pairs in adjacent transistor rows of said sense amplifiers;

said signal interconnects associated with said sense amplifiers running parallel to said transistor rows, said signal interconnects for supplying the actuation signals to said amplification transistors having a substantially identical arrangement symmetry relative to said transistor rows as said amplification transistors, such that said amplification transistors in adjacent said transistor rows are disposed in a same interconnect proximity with regard to said signal interconnects for supplying the actuation signals to said amplification transistors;

said signal interconnects including a first signal interconnect for a first actuation signal and a second signal interconnect for a second actuation signal, said first signal interconnect running centrally between two said transistor rows, and said second signal interconnect being split into two parallel signal interconnect sections running symmetrically on both sides of said first signal interconnect;

a signal supply interconnect for supplying said first signal interconnect with the first actuation signal, said signal supply interconnect running transversely with respect to said first signal interconnect on one side of said first signal interconnect in a region of one said transistor row; and a dummy signal supply interconnect identical to said signal supply interconnect and running transversely with respect to said first signal interconnect on another side of said first signal interconnect in a region of the other transistor row, such that said amplification transistors in said adjacent transistor rows are formed in a same signal supply interconnect proximity.

Accordingly, the invention provides a fully symmetrical signal interconnect in proximity for the amplification transistors in adjacent transistor rows. In other words, each amplification transistor "sees" the same signal interconnect environment, which means that the sense amplifiers comprising these transistors have a symmetrical response even when small bit line signals are applied.

The underlying concept behind the invention can also be understood to be that the highly symmetrical transistor structures, which are distributed over transistor rows running parallel to one another, have correspondingly highly symmetrical signal interconnect structures associated with them whose symmetry corresponds to the symmetry of the amplification transistor structures. In contrast to this, the prior art provides a highly symmetrical arrangement of the transistor structures, but no highly symmetrical arrangement which correlates thereto, rather an asymmetrical arrangement of the signal interconnect structures in association with the transistor structures, which is why the DRAM memory component based on the prior art results in an asymmetrical response from the sense amplifiers when small bit line signals are applied.

The inventive concept is realized for the integrated DRAM memory component in question, which has a first signal interconnect for a first actuation signal and a second signal interconnect for a second actuation signal, by virtue of the first signal interconnect running between two transistor rows, while the second signal interconnect is split into two parallel signal interconnects which run symmetrically on both sides of the first signal line.

The general inventive concept can be applied not just to symmetrical proximity for all the amplification transistors not just in relation to the signal inter-connects, but also to signal supply interconnects for supplying the signal interconnects with an actuation signal, the respective signal supply interconnect running transversely with respect to the respective signal interconnect on one side of the latter in the region of a transistor row. In the case of such a signal interconnect/signal supply interconnect structure, the invention provides for a dummy signal supply interconnect, which is identical to the signal supply interconnect, to be arranged in the region of the opposite transistor row such that the amplification transistors in the adjacent transistor rows are in the same signal supply interconnect proximity. Other features which are considered as characteristic for the invention are set forth in the appended claims.

Although the invention is illustrated and described herein as embodied in an integrated DRAM memory component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view of a layout for the gate level of sense amplifiers in an integrated DRAM memory component based on the invention.

DESCRIPTION OF THE PREFERRED EMBODIMENTS

Figure 1:
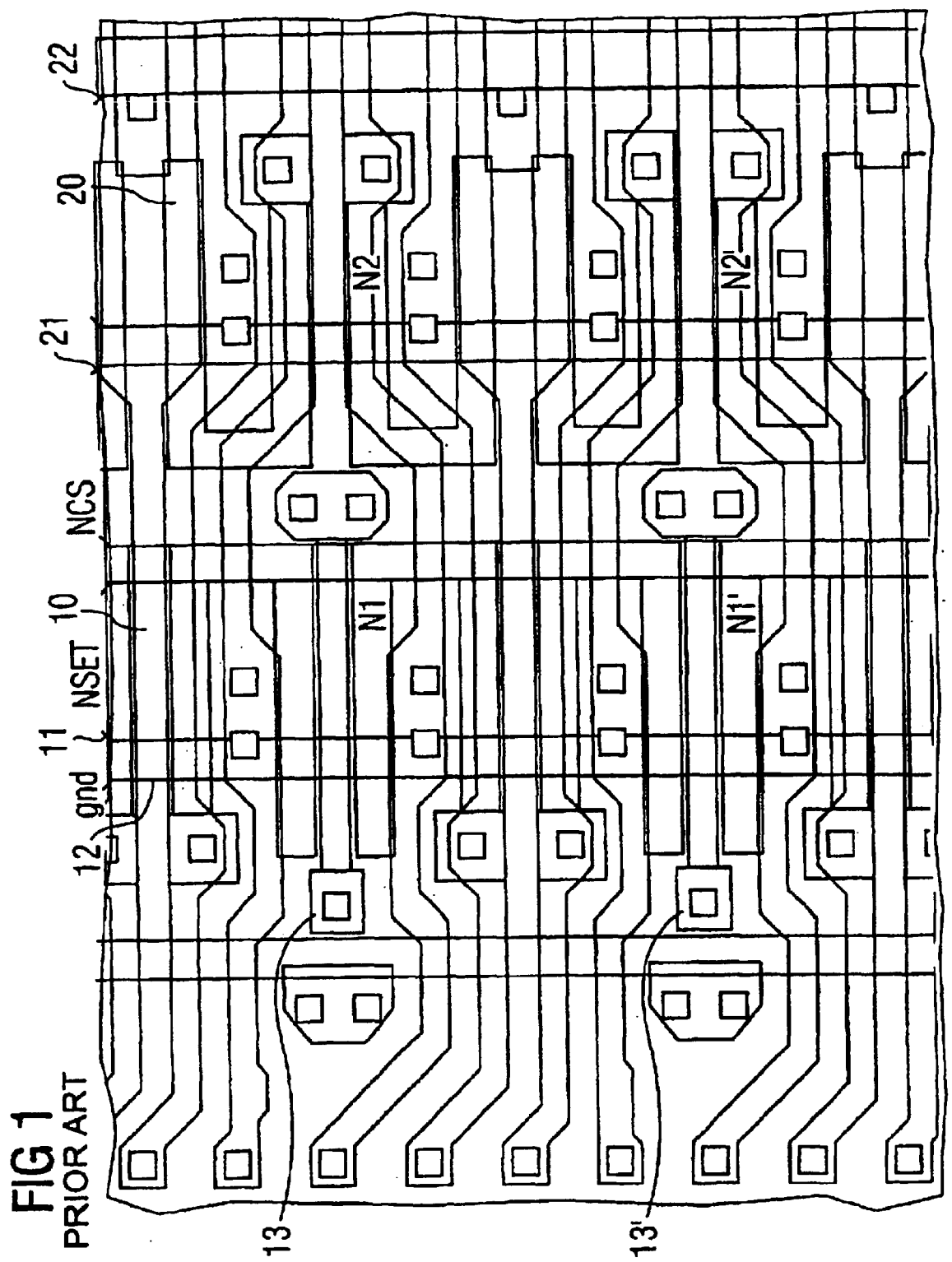
FIG. 1 is a partial plan view of a layout for the gate level of sense amplifiers in an integrated DRAM memory component according to the prior art.

Referring now to the figures of the drawing in detail, there are shown two adjacent transistor rows at the level of their gates. These amplification transistors are used to amplify sense amplifier actuation signals NCS and NSET (NCS stands for Negative Current Supply, NSET stands for N-transistor Set). The transistor rows shown in FIGS. 1 and 2 are denoted generally by references 10 and 20.

The transistor row 10 comprises amplification transistors N1, N1', . . . arranged in series. In the same way, the transistor row 20 comprises amplification transistors N2, N2'. At the gate level shown, the transistors comprise strip-like elements which run transversely with respect to the longitudinal directions of the transistor rows 10, 20.

The actuation currents for the amplification transistors N1, N2 are supplied via signal interconnects that run parallel to the transistor lines 10, 20 in a wafer layer which is isolated therefrom.

Referring now more specifically to FIG. 1, there is shown the structure of an integrated DRAM memory component based on the prior art at a gate level. The signal interconnects are denoted by 11 and 21, and the signal interconnect 11 carries the actuation signal NSET while the signal interconnect 21 carries the actuation signal NCS. The signal interconnect 11 runs entirely in the region of the actuation transistors N1, N1' in the transistor line 10, while the signal interconnect 21 runs adjacently to the signal interconnect 11 partially between the transistor rows 10, 20 and partially over the transistor row 20, partially covering the amplification transistors N2, N2'. The figure also shows ground interconnects 12, 22 which run at the side of the signal interconnects 11, 21 and partially cover the respective amplification transistors N1, N2'. . . and N2, N2', . . . .

FIG. 1 shows that the symmetry of the transistor lines 10, 20 does not match the symmetry of the signal supply interconnects. The result of this is that the amplification transistors N1, N2 in the adjacent transistor rows 10, 20 "see" different signal interconnect proximities. In other words, the amplification transistors in the different transistor rows 10, 20 experience a different capacitive coupling for the actuation signals NSET and NCS, as a result of which the sense amplifiers comprising these amplification transistors have an asymmetrical response, particularly in the case of small bit line signals.

This drawback is overcome in the integrated DRAM memory component shown in FIG. 2 by virtue of the invention providing that the amplification transistors have an identical signal interconnect proximity associated with them. This is achieved by virtue of the signal interconnect structure having the same high level of symmetry associated with it as the transistor structures and by virtue of these symmetries being matched to one another such that each amplification transistor in each transistor row is in the same signal interconnect proximity.

Specifically, the signal interconnect 21 carrying the actuation signal NCS is arranged between the transistor lines 10 and 20 such that it is at the same distance from these lines, as a result of which the amplification transistors N1, N1', . . . and N2, N2', . . . in the rows 10, 20 have the same signal interconnect proximity in relation to the line 21.

In the structure in FIG. 2, the signal interconnect 11 in the arrangement in FIG. 2 is divided into two signal interconnect sections 11A, 11B, which supply the actuation signal NSET to the amplification transistors N1, N2 to the same extent. In particular, the signal interconnect section 11A runs in the same relative position over the transistors N1, N1', . . . in the transistor row 10 as the signal interconnect section 11B runs in relation to the amplification transistors N2, N2', . . . in the transistor row 20. Hence, the transistors N1, N2 in the transistor lines 10, 20 are in the same signal interconnect proximity in relation to the supply of the signal NSET. The configuration of the ground lines 12, 22 is the same as for the structure in FIG. 1.

In FIG. 1, signal supply interconnects for supplying the actuation signal NCS to the signal interconnect 21 are denoted by the reference numerals 13 and 13'. These signal supply interconnects 13, 13' run transversely with respect to the signal interconnect 21, and only this signal interconnect 21 is provided with the supply interconnects 13, 13' in the region shown, while the opposite transistor line 20 does not have such signal supply interconnects in the region shown. Hence, with regard to the signal supply interconnects, there is an unequal proximity ratio for the amplification transistors N1, N1', . . . associated with the signal interconnect 10 as compared with the amplification transistors N2, N2', . . . associated with the signal interconnect 20.

In order to avoid this unequal proximity for the transistors, the signal supply interconnects 13, 13' in the structure in FIG. 2 are provided with corresponding dummy signal supply interconnects 14, 14' in the region of the transistor line 20, which are likewise supplied with the actuation signal NCS. The effect achieved by this is that the amplification transistors N2, N2', . . . in the transistor line 20 have the same signal supply interconnect proximity as the amplification transistors N1, N1', . . . in the transistor line 10.

On account of identical signal interconnect/signal supply interconnect proximities, the sense amplifiers in the integrated DRAM memory component in question with the design shown in FIG. 2 are in a form such that their response is always symmetrical even when small bit line signals are applied.

We claim:

1. An integrated DRAM memory component, comprising:

sense amplifiers each formed from mutually adjacent transistor rows and having amplification transistors for bit line signal amplification and signal interconnects for supplying actuation signals to said amplification transistors;

said amplification transistors being structurally identical and being disposed opposite one another in pairs in adjacent transistor rows of said sense amplifiers;

said signal interconnects associated with said sense amplifiers running parallel to said transistor rows, said signal interconnects for supplying the actuation signals to said amplification transistors having a substantially identical arrangement symmetry relative to said transistor rows as said amplification transistors, such that said amplification transistors in adjacent said transistor rows are disposed in a same interconnect proximity with regard to said signal interconnects for supplying the actuation signals to said amplification transistors;

said signal interconnects including a first signal interconnect for a first actuation signal and a second signal interconnect for a second actuation signal, said first signal interconnect running centrally between two said transistor rows, and said second signal interconnect being split into two parallel signal interconnect sections running symmetrically on both sides of said first signal interconnect;

a signal supply interconnect for supplying said first signal interconnect with the first actuation signal, said signal supply interconnect running transversely with respect to said first signal interconnect on one side of said first signal interconnect in a region of one said transistor row; and a dummy signal supply interconnect identical to said signal supply interconnect and running transversely with respect to said first signal interconnect on another side of said first signal interconnect in a region of the other transistor row, such that said amplification transistors in said adjacent transistor rows are formed in a same signal supply interconnect proximity.

* * * * *